(12) United States Patent
Nishiura et al.

(10) Patent No.: US 7,299,966 B2
(45) Date of Patent: Nov. 27, 2007

(54) INITIAL BALL FORMING METHOD FOR WIRE BONDING WIRE AND WIRE BONDING APPARATUS

(75) Inventors: Shinichi Nishiura, Fussa (JP); Mitsuaki Sakakura, Iruma (JP); Fumio Miyano, Akiruno (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/462,928

(22) Filed: Jun. 17, 2003

(65) Prior Publication Data

US 2004/0000578 A1    Jan. 1, 2004

(30) Foreign Application Priority Data

Jun. 26, 2002    (JP) .............................. 2002-186731

(51) Int. Cl.
  *B23K 31/02*    (2006.01)
  *B23K 37/00*    (2006.01)

(52) U.S. Cl. .................. 228/180.5; 228/4.5; 219/76.13

(58) Field of Classification Search ............. 228/180.5, 228/4.5; 438/613; 219/76.13
See application file for complete search history.

(56) References Cited

U.S. PATENT DOCUMENTS

| | | | | |
|---|---|---|---|---|
| 4,814,855 A | * | 3/1989 | Hodgson et al. | 174/52.4 |
| 4,998,002 A | * | 3/1991 | Okikawa et al. | 219/56.22 |
| 5,152,450 A | * | 10/1992 | Okikawa et al. | 228/180.5 |
| 5,176,310 A | * | 1/1993 | Akiyama et al. | 228/180.5 |
| 5,285,949 A | * | 2/1994 | Okikawa et al. | 228/179.1 |
| 6,110,823 A | * | 8/2000 | Eldridge et al. | 438/660 |
| 6,270,000 B1 | * | 8/2001 | Nishiura | 228/180.5 |
| 6,564,989 B2 | * | 5/2003 | Arakawa | 228/180.5 |
| 6,776,324 B2 | * | 8/2004 | Morita | 228/1.1 |
| 2002/0014685 A1 | * | 2/2002 | Tsukahara | 257/673 |
| 2003/0098330 A1 | * | 5/2003 | Morita | 228/4.5 |
| 2004/0000577 A1 | * | 1/2004 | Nishiura et al. | 228/180.5 |
| 2004/0000578 A1 | * | 1/2004 | Nishiura et al. | 228/180.5 |

FOREIGN PATENT DOCUMENTS

| | | |
|---|---|---|
| JP | 405206357 A * | 8/1993 |
| JP | 407193099 A * | 7/1995 |
| JP | 8-107123 | 4/1996 |

OTHER PUBLICATIONS

U.S. Appl. No. 10/463,464, Pending App., Shaw, Venson M.
U.S. Appl. No. 10/410,663, Pending App., Shaw, Venson M.
U.S. Appl. No. 10/410,662, Pending App., Shaw, Venson M.

* cited by examiner

*Primary Examiner*—Jonathan Johnson
*Assistant Examiner*—Rachel E. Beveridge
(74) *Attorney, Agent, or Firm*—Koda & Androlia

(57) ABSTRACT

An initial ball forming method for wire bonding wire and wire bonding apparatus that uses: a capillary through which a wire is passed; a torch electrode made of a low-melting-point material that contains, for instance, tin; and a direct-current high voltage power supply. When the direct-current high voltage power supply is turned ON, a space discharge occurs between the tip end of the wire and the torch electrode, resulting in that the wire tip end melts and is formed into a ball and that the tin of the torch electrode is also heated to a high temperature and diffused into space, so that ionized plus tin ions are attracted to the tip end of the melted wire, thus causing tin to adhere to the surface of the ball-shaped tip end of the wire, and forming an initial ball that has a low-melting-point coating material adhered to its surface.

10 Claims, 1 Drawing Sheet

INITIAL BALL FORMING METHOD FOR WIRE BONDING WIRE AND WIRE BONDING APPARATUS

BACKGROUND OF THE INVENTION

1. Field of the Invention

The present invention relates to an initial ball forming method for a wire used in wire bonding and to a wire bonding apparatus.

2. Prior Art

In wire bonding techniques, input and output terminals, etc. (bonding pads) of semiconductor chips such as LSIs, etc. and terminals (bonding leads) of packages or circuit boards on which the semiconductor chips are mounted are connected by fine metal wires.

Gold wires, for instance, are used as the wires that connect bonding pads and bonding leads; and when such gold wires are initially bonded to the bonding pads, the tip end of a gold wire that is passed through a tube called a capillary is formed into a ball shape. The ball-shaped entity that is formed on the tip end of this gold wire is generally called an initial ball. Such a general initial ball is obtained by applying a high voltage across the wire and a torch electrode that is disposed so as to face the tip end of the wire, so that a space discharge is caused to take place between the electrode and the wire, thus melting the tip end of the wire by the energy of this discharge, thus making the tip end into a ball shape. In this case, the material of the torch electrode that is used generally has a higher melting point than that of the wire material.

The process that connects by wires the bonding pads and bonding leads is performed in two stages. First, a first-stage bonding operation is performed by pressing the general initial ball against the aluminum bonding pad of the semiconductor chip, and applying ultrasonic energy while heating this initial ball. Then, the wire is extended from the end that is bonded to the aluminum bonding pad, and the other end of the wire is moved to a point above the gold bonding lead of the circuit board to which the wire is to be bonded. Then, a second-stage bonding operation is performed by pressing the other end of the moved wire against this bonding lead, and applying ultrasonic energy while heating the wire.

In the bonding of the bonding pad and gold wire, a specified wire bonding strength, e.g., peeling strength, can be obtained by setting the pressing pressure, heating temperature and ultrasonic energy that is applied at appropriate values. The thermal energy created by heating has the function of making it possible to reduce the ultrasonic energy that is required; for example, in cases where heating can be performed at a sufficiently high temperature, bonding can be accomplished without applying ultrasonic energy. There are various theories regarding the mechanism of the bonding between an aluminum bonding pad and a gold wire; however, it appears that the aluminum surface oxide film is ruptured by the energy that is applied, and that the underlying newly generated aluminum surface and the gold are bonded by a type of eutectic phenomenon.

Thus, in the case of conventional wire bonding, gold wires have generally been bonded to aluminum bonding pads. In recent years, as ultra-fine miniaturization of LSIs has progressed, copper wiring techniques which makes it possible to lower the wiring resistance inside semiconductor chips have attracted attention. In such cases, it is preferable to use copper materials for the bonding pads, both from the standpoint of the process and the standpoint of materials.

However, bonding of gold wires to copper bonding pads involves several problems. More specifically, a copper oxide film is formed on the surfaces of copper bonding pads, and this oxide film on the copper surface has extremely poor bonding characteristics compared to the oxide film formed on the surfaces of aluminum bonding pads. For example, even if the general initial ball of a gold wire is pressed against the surface of a copper bonding pad and ultrasonic energy of considerable strength is applied, this merely results in the generation of several fractures in the general initial ball; and no bonding occurs between the copper and gold. Furthermore, when the copper surface is heated, oxidation occurs more violently as the metal color of the surface varies conspicuously. Accordingly, it is difficult to utilize thermal energy generated by heating.

This problem comes from the fact that the manner in which copper is oxidized differs from the manner in which aluminum is oxidized. In other words, as is well known, the surface of aluminum is easily oxidized; however, the resulting oxide film is dense; and when this film grows to a certain fixed film thickness, there is almost no further oxidation. Furthermore, the surface oxide film on aluminum is also stable in chemical terms, and any oxide film of this type has more or less fixed physical characteristics. Accordingly, the wire bonding conditions such as pressing pressure, heating temperature, ultrasonic energy, etc. that are used to rupture the surface oxide film on an aluminum bonding pad can be set with good reproducibility.

On the other hand, the oxide film that is formed on the surface of copper has a low density, and oxidation continues to progress toward the interior of the copper. Furthermore, in the case of a copper oxide film, both the film thickness and the physical properties show a large amount of variation according to the degree of oxidation. Accordingly, a thick copper oxide film has great variation in physical properties, etc., which cannot be compared with the surface oxide film on an aluminum bonding pad, is present on the surface of a copper bonding pad. Furthermore, the presence of this surface oxide film on a copper bonding pad constitutes a great impediment to wire bonding.

SUMMARY OF THE INVENTION

Accordingly, the object of the present invention is to solve such problems encountered in the prior art and to provide an initial ball forming method for a wire bonding wire and a wire bonding apparatus that can use copper as the object of wire bonding.

The present invention is based on the finding that a gold wire can easily be bonded to a copper bonding pad if an initial ball which has a low-melting-point material adhering to the surface is used.

The content of a bonding experiment involving bonding between an initial ball with a low-melting-point material adhering to the surface and a copper bonding pad will be described below.

A circuit board on which an LSI chip with copper bonding pads was mounted was set on the bonding table of a bonding apparatus. A gold wire with a diameter of 20 microns (μm) was passed through the capillary of the bonding apparatus. A discharge voltage was applied across the wire and a torch electrode made of a coating material (tin) which had a lower melting point than that of the wire. The tip end of the wire was melted and formed into a ball shape, and tin ions were caused to adhere to the surface of this ball shape using the energy of the discharge. Then, the capillary holding the initial ball with tin adhering to the surface was moved, the ball was pressed against one of the copper bonding pads, and ultrasonic energy was applied to this initial ball and the copper bonding pad by ultrasonic energy supplying means. Bonding was attempted at ordinary temperature, without heating the substrate, etc., on which the LSI chip was mounted.

The pressing force was 400 mN (a weight of approximately 40 grams), and the press-bonding diameter constituting the planar dimension following deformation of the initial ball by this pressing force was approximately 50 microns (μm). The magnitude of the ultrasonic energy was the same as that used in the wire bonding of a gold wire to an ordinary aluminum pad. As a result, the gold wire and copper bonding pad were bonded, and the peeling strength was sufficient for practical purposes.

Thus, by pressing an initial ball with tin adhering to the surface against a copper bonding pad, and applying ultrasonic energy, it was possible to obtain a bond with a sufficient peeling strength (approximately 200 mN or a weight of 20 grams) at ordinary temperature between this copper bonding pad and a gold wire.

In regard to the mechanism of bonding, for example, it is possible to consider a model in which the low-melting-point tin is melted by the ultrasonic energy, and ultrasound acts on the melted tin so that cavitation occurs, i.e., so that bubbles in a vacuum state are generated. More specifically, according to this model, a shock wave is generated when the bubbles in a vacuum state rupture, and the thick copper oxide film is destroyed by this shock wave, so that bonding takes place between the underlying newly generated copper surface and the initial ball. It is well known that heat is generated in a metallic solid by ultrasonic energy, and it is also well known that cavitation can be generated in a liquid by ultrasonic energy.

Based upon the findings above, the method of the present invention for forming an initial ball for a wire bonding wire is characterized by the fact that a discharge voltage is applied across a wire and a torch electrode made of a coating material whose melting point is lower than that of the wire, thus melting the tip end of the wire and making a ball shape end, thus forming an initial ball that comprises the above-described ball shape end of which surface being adhered with the above-described coating material.

In this way, using discharge energy, an initial ball with a low-melting-point coating material adhered to its surface is obtained; and by using this initial ball, a gold wire and a copper bonding pad can be bonded together even though a thick copper oxide film exists on the copper bonding pad.

It is preferable that the discharge voltage be a direct-current high voltage that places the wire at a minus potential with respect to the torch electrode. With this arrangement, the low-melting-point material is ionized by the discharge to form plus metal ions, and these ions adhere with good efficiency to the wire which is at a minus potential with respect to the torch electrode.

Besides a wire that is chiefly made of gold, the wire can be a wire chiefly made of copper. It is preferable that the low-melting-point coating material contain, as primary component, tin or indium.

Furthermore, the method of the present invention for forming an initial ball for a wire used in wire bonding is characterized by making a ball-form ball base on a tip end of a wire, thus obtaining an initial ball in which a surface of the ball base is adhered with a coating material whose melting point is lower than that of the wire.

It is preferable that the melting point of the coating material be between 110° C. and 240° C.

Furthermore, the wire bonding apparatus of the present invention is characterized by the fact that the bonding apparatus is comprised of:
a capillary through which a wire is passed, the capillary positioning the wire with the wire protruding form a tip end of the capillary,
a torch electrode made of a coating material whose melting point is lower than that of the wire, and
a discharge voltage application means that applies a discharge voltage to the wire with the wire set at a minus potential with respect to the torch electrode, the discharge voltage application means melting the tip end of the wire and making a ball shape end, thus forming an initial ball that comprises the ball shape end on which surface being adhered with the coating material.

Furthermore, the wire bonding apparatus of the present invention is characterized by the fact that the wire bonding apparatus is comprised of:
a capillary through which a wire is passed, the capillary positioning the wire with the wire protruding form a tip end of the capillary; and
an initial ball forming means that forms a ball-form ball base on a tip end of the wire and form an initial ball in which a coating material whose melting point is lower than that of the wire is adhered to a surface of the ball base.

Furthermore, the melting point of the coating material is preferably between 110° C. and 240° C.

DETAILED DESCRIPTION OF THE INVENTION

Figure 1:
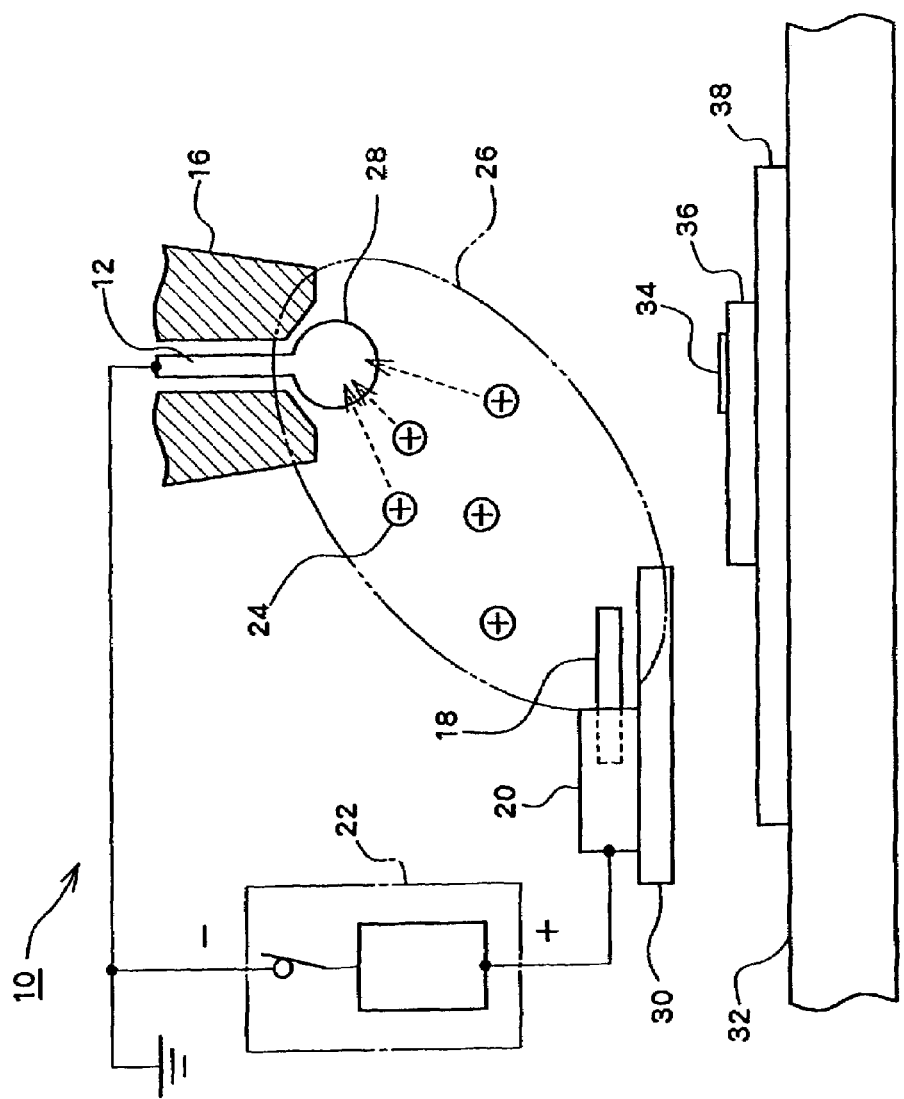
FIG. 1 shows the manner of forming an initial ball that has a low-melting-point coating material adhering to its surface in a wire bonding apparatus according to embodiments of the present invention.

Embodiment of the present invention will be described in detail below with reference to the accompanying drawings. FIG. 1 shows how an initial ball 28 is formed on the tip end of a wire 12 used in wire bonding in a wire bonding apparatus 10.

The wire bonding apparatus 10 is comprised of a capillary 16 through which a wire 12 is passed and which positions this wire so that the wire protrudes from the tip end of the capillary 16, a torch electrode 18 which is disposed so as to face the tip end of the wire 12, a torch electrode supporting element 20 which supports the torch electrode 18, and a direct-current high voltage power supply 22 which applies a discharge voltage across the wire 12 and torch electrode 18. A protective cover 30 made of an insulating material is disposed on the torch electrode 18 at a position that is opposite from the side that faces the wire.

The wire bonding apparatus 10 further includes a bonding table 32. The bonding table holds an LSI chip 36, which has bonding pads 34, and a circuit board 38.

The direct-current high voltage power supply 22 is a discharge voltage application means that causes an electric discharge to take place between the wire 12 and the torch electrode 18. The direct-current high voltage power supply 22 is connected so that the wire 12 is placed at a minus potential with respect to the torch electrode 18.

A coating material whose melting point is lower than that of the wire, e.g., a low-melting-point material that contains, as primary component, tin whose melting point is approximately 230° C., is used as the material of the torch electrode 18. Alternatively, a low-melting-point material that contains, as primary component, indium whose melting point is approximately 150° C. can also be used. Furthermore, other alloys whose melting points are lower than that of the wire can be used also. For example, an alloy having a melting point of between 110° C. and 240° C. can be used.

The torch electrode 18 can be made of a low-melting-point coating material for its entirety, or only a portion of this electrode can be made of such a low-melting-point coating material. For example, only the tip end of the torch electrode 18 can be made of a low-melting-point coating material, or only the outer circumferential portion of the torch electrode 18 can be made of a low-melting-point coating material.

Furthermore, as will be described below, a diffusion-directionality means that imparts directionality to the direction of diffusion when the low-melting-point material is ionized and diffused by the discharge can be provided on the torch electrode 18. For example, by way of covering the circumference of the low-melting-point material by an insulating body and opening holes in of this insulating body, the low-melting-point material can have directionality in the direction of such holes.

The torch electrode 18 is provided on the torch electrode supporting element 20 in such a manner that the torch electrode 18 is replaceable, and it has a function that the discharge voltage from the direct-current high voltage power supply 22 is allowed to be transmitted to the torch electrode 18. Thus, the torch electrode supporting element 20 can be constructed from a metal member that has a hole, into which the torch electrode 18 is inserted, and bolts, which fasten the torch electrode 18 in place while ensuring electrical continuity with the inserted torch electrode 18.

With the structure described above, in order to perform wire bonding, the LSI chip 36 and the circuit board 38 are first placed in position so as to be held on the bonding table 32. It is assumed that the bonding pads 34 of the LSI chip 36 are copper.

Next, an initial ball which has a low-melting-point material adhering to the surface is formed on the tip end of a wire. A gold wire with a diameter of, for instance, 20 microns (μm) is used as the wire 12, and this wire 12 is passed through the capillary 16 and positioned so that the tip end of the wire protrudes from the capillary 16 by a clamping mechanism (not shown). Next, the torch electrode 18 made of tin, which is provided on the torch electrode supporting element 20, is moved using a moving mechanism (not shown), so that the torch electrode 18 and tip end of the wire 12 are positioned in a predetermined relationship facing each other. This positioning can be a fixed relationship from the beginning without using a moving mechanism. The protective cover 30 in this case is disposed so that the discharge described later does not occur between the torch electrode 18 and the LSI chip 36 or the circuit board 38.

Then, the switch of the direct-current high voltage power supply 22 is turned ON, so that a discharge voltage is applied across the wire 12 and torch electrode 18.

As a result, a space discharge occurs between the tip end of the wire 12 and the torch electrode 18, so that the tip end of the wire 12 is heated and melted and is formed into the shape of a ball. The discharge time is several milliseconds.

The ball-form portion that is formed as a result has a diameter of approximately 40 microns (μm). When the surface of this ball-form portion is analyzed, the element composition is 70% gold and 30% tin. In other words, as described above, an initial ball with low-melting-point tin adhering to the surface is obtained.

The mechanism that provides an initial ball having low-melting-point tin adhering to its surface by means of a discharge using the wire bonding apparatus 10 constructed as described above can be viewed as described below.

More specifically, when the switch of the direct-current high voltage power supply 22 is turned ON, and a discharge voltage is applied across the wire 12 and torch electrode 18, a space discharge occurs between the tip end of the wire 12 and the torch electrode 18. The tip end of the wire 12 is heated and melted by this discharge energy; and at the same time, the tin of the torch electrode 18 is also heated to a high temperature and scattered into space. This tin is dissociated and ionized in the presence of a high voltage, so that a dissociated gas 26 that contains plus tin ions 24 is formed. Then, the plus tin ions 24 are attracted to the melted tip end of the wire which is at a minus potential with respect to the torch electrode 18. As a result of these processes, the tip end of the wire 12 is melted by the discharge and formed into a ball shape, and tin is caused to adhere to the surface of this ball by the discharge energy.

The initial ball 28 having tin adhering to its surface that is thus obtained is used in order to perform bonding with a copper bonding pad 34. In this bonding, the capillary 16 having this initial ball 28 is moved "as is", and the initial ball 28 is pressed against the copper bonding pad 34 of the LSI chip 36. Then, ultrasonic energy is applied to the pressed initial ball 28 and copper bonding pad 34 using ultrasonic energy supplying means (not shown). During this process, the LSI chip 36, etc. need not be heated; however, in cases where heating is applied, it is necessary to introduce an inert gas, etc., so that excessive oxidation of the copper surface is suppressed.

In this way, as described in Summary of the Invention section above, a bond between a gold wire and a copper bonding pad which has a peeling strength that is sufficient for practical purposes is obtained by setting the pressing force at 400 mN (a weight of approximately 40 grams) and applying ultrasonic energy to the same extent as that used in the wire bonding of a gold wire to an ordinary aluminum pad.

In the above, wire bonding between a gold wire and a copper bonding pad is described. However, the present invention is applicable to a bonding that uses a wire chiefly made of copper. In this case, the material of the mating bonding pad can be a metal other than copper. For example, the bonding pad can be an aluminum pad or gold pad. Furthermore, the copper bonding pad is described as a bonding pad of a semiconductor chip in the above. However, the present invention is applicable to copper bonding leads of circuit boards.

Furthermore, in the above, a method that uses discharge energy for obtaining an initial ball formed with an adhering low-melting-point coating material is described. However, the present invention is applicable to other manner of method for forming an initial ball having adhered low-melting-point coating material. For instance, it is possible to obtain an initial ball by dipping a wire that has a ball-shape tip end into a solution that contains a low-melting-point material so that a low-melting-point coating material is caused to adhere to the surface of the tip end ball or by using an ink jet technique that causes particles, etc. of a low-melting-point material to adhere to a tip end ball.

As seen from the above, according to the present invention, connections involving copper can be accomplished by a simple and convenient method without any particular increase in the number of semiconductor manufacturing processes required. Furthermore, a sufficient bonding strength can be obtained even at room temperatures, and a favorable connection quality can be obtained without any effects of copper oxidation caused by an increase in temperature.

With the use of the method for forming an initial ball on a wire used in wire bonding and the wire bonding apparatus of the present invention, it becomes possible to use copper as an object of wire bonding.

The invention claimed is:

1. An initial ball forming method for a wire used in wire bonding, comprising applying a discharge voltage across a wire and a torch electrode made of a coating material whose melting point is lower than that of said wire, thus melting a tip end of said wire and making a ball shape end, thus forming an initial ball that comprises said ball shape end of which surface being adhered with said coating material.

2. The initial ball forming method according to claim 1, wherein said discharge voltage is a direct-current high voltage that places said wire at a minus potential with respect to said torch electrode.

3. The initial ball forming method according to claim 1 or 2, wherein said coating material is a low-melting-point material that contains, as primary component, one selected from the group consisting of tin and indium.

4. The initial ball forming method according to claim 1 or 2, wherein said wire is chiefly made of one selected from the group consisting of gold and copper.

5. The initial ball forming method according to claim 3, wherein said wire is chiefly made of one selected from the group consisting of gold and copper.

6. A wire bonding apparatus comprising:
a capillary through which a wire is passed, said capillary positioning said wire with said wire protruding form a tip end of said capillary,
a torch electrode made of a coating material whose melting point is lower than that of said wire, and
a discharge voltage application means that applies a discharge voltage to said wire with said wire set at a minus potential with respect to said torch electrode, said discharge voltage application means melting said tip end of said wire and making a ball shape end, thus forming an initial ball that comprises said ball shape end on which surface being adhered with said coating material.

7. The initial ball forming method according to claim 6, wherein said coating material is a low-melting-point material that contains, as primary component, one selected from the group consisting of tin and indium.

8. The initial ball forming method according to claim 6 or 7, wherein said wire is chiefly made of one selected from the group consisting of gold and copper.

9. A wire bonding apparatus comprising:
a capillary through which a wire is passed, said capillary positioning said wire with said wire protruding form a tip end of said capillary,
an initial ball forming means that forms a ball-form ball base on a tip end of said wire and form an initial ball in which a coating material whose melting point is lower than that of said wire is adhered to a surface of said ball base.

10. The wire bonding apparatus according to claim 9, wherein a melting point of said coating material is between 110° C. and 240° C.

* * * * *